(12) United States Patent
Leisl, III et al.

(10) Patent No.: US 11,547,001 B2
(45) Date of Patent: *Jan. 3, 2023

(54) CONSUMER APPLIANCE AND TOUCH PANEL INTERFACE

(71) Applicant: Haier US Appliance Solutions, Inc., Wilmington, DE (US)

(72) Inventors: Donald James Leisl, III, Louisville, KY (US); Richard Gary Woodham, Jr., Taylorsville, KY (US)

(73) Assignee: Haier US Appliance Solutions, Inc., Wilmington, DE (US)

(*) Notice: Subject to any disclaimer, the term of this patent is extended or adjusted under 35 U.S.C. 154(b) by 363 days.

This patent is subject to a terminal disclaimer.

(21) Appl. No.: 16/804,323

(22) Filed: Feb. 28, 2020

(65) Prior Publication Data

US 2021/0269960 A1  Sep. 2, 2021

(51) Int. Cl.
| | |
|---|---|
| *H05K 5/00* | (2006.01) |
| *D06F 34/32* | (2020.01) |
| *D06F 34/28* | (2020.01) |
| *D06F 34/34* | (2020.01) |
| *G06F 3/044* | (2006.01) |
| *D06F 34/08* | (2020.01) |
| *D06F 34/00* | (2020.01) |
| *D06F 103/10* | (2020.01) |

(52) U.S. Cl.
CPC ........... *H05K 5/0017* (2013.01); *D06F 34/28* (2020.02); *D06F 34/32* (2020.02); *D06F 34/00* (2020.02); *D06F 34/08* (2020.02); *D06F 34/34* (2020.02); *D06F 2103/10* (2020.02); *G06F 3/044* (2013.01); *G06F 2203/04102* (2013.01)

(58) Field of Classification Search
CPC .......... D06F 34/28; D06F 34/08; D06F 34/32; H03K 2217/960785; H03K 17/9622; G06F 3/045; H05K 5/0017
See application file for complete search history.

(56) References Cited

U.S. PATENT DOCUMENTS

| | | | |
|---|---|---|---|
| 8,581,133 B2 | 11/2013 | Kaps et al. | |
| 9,615,468 B2* | 4/2017 | Moncrieff | ............ G02B 6/0001 |
| 2011/0148777 A1 | 6/2011 | Meng | |
| 2019/0287892 A1* | 9/2019 | Sääski et al. | ........ H01L 25/0657 |
| 2020/0018004 A1* | 1/2020 | Leisl, III | .............. H05K 5/0017 |

FOREIGN PATENT DOCUMENTS

| | | |
|---|---|---|
| CN | 202720538 U | 2/2013 |
| CN | 207408928 U | 5/2018 |
| WO | WO2019120583 A1 | 6/2019 |

\* cited by examiner

*Primary Examiner* — Joseph L. Perrin
*Assistant Examiner* — Kevin G Lee
(74) *Attorney, Agent, or Firm* — Dority & Manning, P.A.

(57) ABSTRACT

A consumer appliance or touch panel interface, as provided herein, may include a substrate panel, a flexible capacitance touch circuit, a deformable conductive joint, and a rigid circuit board. The flexible capacitance touch circuit may be joined to the substrate panel. The deformable conductive joint may extend from a first end to a second end. The first end may be bonded to the flexible capacitance touch circuit. The rigid circuit board may be bonded to the deformable conductive joint at the second end, the rigid circuit board being positioned behind the substrate panel along the axial direction.

18 Claims, 7 Drawing Sheets

CONSUMER APPLIANCE AND TOUCH PANEL INTERFACE

FIELD OF THE INVENTION

The present subject matter relates generally to user interfaces and displays for consumer appliances, such as a washing machine or dryer appliance.

BACKGROUND OF THE INVENTION

Appliances, such as washing machine appliances, generally include one or more user interfaces. A user interface is often provided to receive instructions or provide feedback to a user regarding operation of the appliance. For instance, a display or one or more input selectors may be provided as part of a user interface.

In the case of washing machine appliances, a cabinet having a tub for containing wash fluid (e.g., water and detergent, bleach, or other fluid additives) is included. A basket is rotatably mounted within the tub and defines a wash chamber for receipt of articles for washing. During operation of such washing machine appliances, wash fluid is directed into the tub and onto articles within the wash chamber of the basket. The basket or an agitation element can rotate at various speeds to, for example, agitate articles within the wash chamber, wring wash fluid from articles within the wash chamber, etc.

A user interface is often provided with one or more input selector components. Such components may display information about the appliance or allow certain operations or wash cycles to be selected by a user. In some cases, the user interface may have a touch panel connected to a flat circuit board, for instance, by a conductive spring or conductive foam pad. The conductive spring or conductive foam pad may help overcome complex (e.g., curved) geometries of the touch panel since, for instance, it is often impractical or impossible to place the flat circuit board in close proximity to a curved touch panel.

Nonetheless, existing user interfaces can become unreliable over time such that changes in capacitance are not detected between the touch panel and the circuit board. For instance, air gaps may form over time between the conductive spring or foam pad and one or more portions of the user interface. These air gaps may lead to input errors and may cause the user interface to become unresponsive. This may be especially true in high-vibration environments, such as on a laundry appliance having a rotating basket or drum. Moreover, although it might be advantageous to assemble some portions of the user interface separately or in advance, current designs make pre-assembly difficult or unfeasible. For instance, movement of a pre-assembled portion of the user interface may increase the potential for air gaps to form.

There is a need, therefore, for a user interface that improves reliability or continued communication between various portions of the user interface, such as between a touch panel and a circuit board.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, an appliance user interface is provided. The appliance user interface may include a substrate panel, a flexible capacitance touch circuit, a deformable conductive joint, and a rigid circuit board. The flexible capacitance touch circuit may be joined to the substrate panel. The deformable conductive joint may extend from a first end to a second end. The first end may be bonded to the flexible capacitance touch circuit. The rigid circuit board may be bonded to the deformable conductive joint at the second end, the rigid circuit board being positioned behind the substrate panel along the axial direction.

In another exemplary aspect of the present disclosure, a laundry appliance is provided for treating articles therein. The laundry appliance may include a cabinet, an interface bracket, and a user interface. The cabinet may define an opening for receipt of the articles to be treated. The interface bracket may be disposed on the cabinet. The user interface may be disposed on the interface bracket. The user interface may include a substrate panel, a flexible capacitance touch circuit, a deformable conductive joint, and a rigid circuit board. The flexible capacitance touch circuit may be joined to the substrate panel. The deformable conductive joint may extend from a first end to a second end. The first end may be bonded to the flexible capacitance touch circuit. The rigid circuit board may be bonded to the deformable conductive joint at the second end. The rigid circuit board may be positioned behind the substrate panel along an axial direction.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
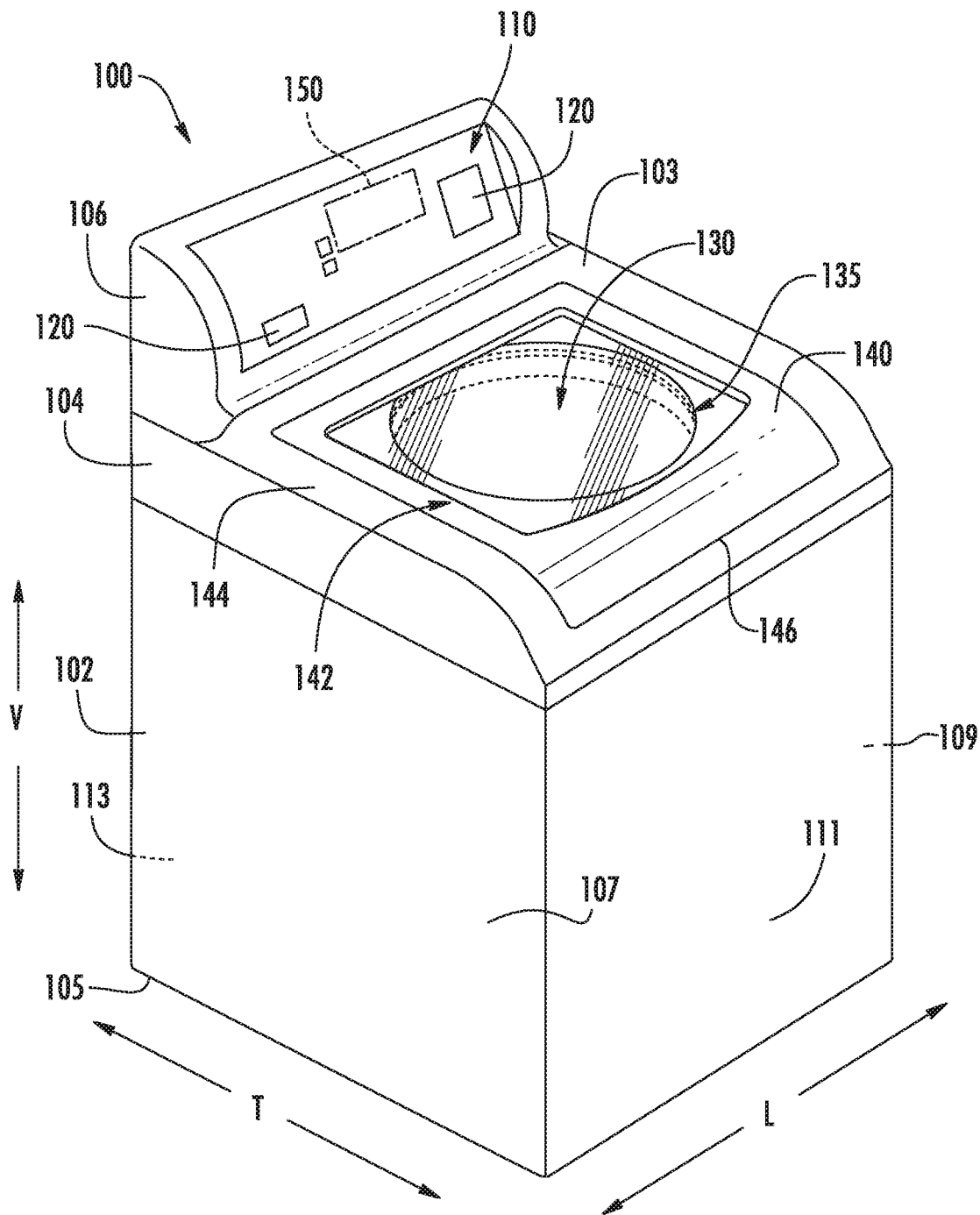
FIG. 1 provides a perspective view of a washing machine appliance according to an exemplary embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the term "or" is generally intended to be inclusive (i.e., "A or B" is intended to mean "A or B or both"). The terms "first," "second," and "third" may be used interchangeably to distinguish one component from another and are not intended to signify location or importance of the individual components. Furthermore, as used herein, terms of approximation, such as "approximately," "substantially," or "about," refer to being within a ten percent margin of error.

As may be seen in FIG. 1, an appliance, such as a washing machine appliance 100, may be provided with a user interface 110 to control certain functions thereof. The appliance 100 may also include a cabinet 102 that defines a vertical direction V, a lateral direction L, and a transverse direction T. The vertical direction V, lateral direction L, and transverse direction T are all mutually perpendicular and form an orthogonal appliance direction system. Generally, cabinet 102 extends between a top portion 103 and a bottom portion 105 along the vertical direction V. Cabinet 102 also extends between a first side portion 107 and a second side portion 109 (e.g., along the lateral direction L), and a front portion 111 and a rear portion 113, (e.g., along the transverse direction T). Although appliance 100 is illustrated as a laundry appliance, and in particular, a washing machine appliance, other embodiments may be provided as additional or alternative appliances, such as another laundry appliance (e.g., dryer appliance), dishwasher appliance, refrigerator appliance, etc. Thus, while described in greater detail below in the context of washing machine appliance 100, the present subject matter may be used in or with any other suitable appliance in alternative exemplary embodiments.

In exemplary embodiments, such as that of FIG. 1, cabinet 102 has a top cover 104 positioned at or adjacent top portion 103 of cabinet 102. Top cover 104 defines an opening 135 that permits user access to wash chamber 130 of wash basket. Door 140 is pivotally attached to top cover 104. However, alternatively, door 140 may be mounted to cabinet 102 or another suitable support. Door 140 selectively rotates a closed position and an open position. In the closed position, door 140 is positioned over opening 135 and inhibits access to wash chamber 130. Conversely, in the open position, a user can access wash chamber 130 through opening 135. Door 140 may also include a handle 146 that (e.g., a user may pull or lift when opening and closing door 140).

Door 140 includes a pivotable frame 144 that may define an aperture above the wash chamber 130. A discrete panel 142 may extend across the aperture such that panel 142 is bounded by a portion of pivotable frame 144 and restricts access through door 140. In some embodiments, panel 142 is configured as a window. For instance, panel 140 may be embodied as a transparent plastic or glass pane. In such embodiments, panel 142 may permit viewing of wash chamber 130 when door 140 is in the closed position (e.g., during operation of washing machine appliance 100).

In some embodiments, a backsplash 106 extends from cover 104. A user interface 110 may be provided on or within the backsplash 106. As will be described in greater detail below, user interface may include one or more control input selectors 120 that are included with or coupled to backsplash 106 (e.g., to control operation of the appliance 100). Generally, input selectors 120 provide an interface whereby the user may operate the machine and select various operation features of the appliance 100. Input selectors 120 can be of a touch type such as touchpad or may include more traditional knobs and dials. A display may also be provided on backsplash 106 for notifying the user of various aspect of the machine's operation including, for example, the mode of operation, water temperature selected, and other relevant information.

Washing machine appliance 100 is controlled by a processing device or controller 150, such as a microprocessor, according to user preference via manipulation of control input selectors 120 mounted on backsplash 106. As used herein, controller 150 may include one or more circuit boards, microprocessors, or semiconductors devices and is not restricted necessarily to a single element. The controller 150 can be programmed to operate washing machine 100 according to features desired by a consumer.

Figure 2:
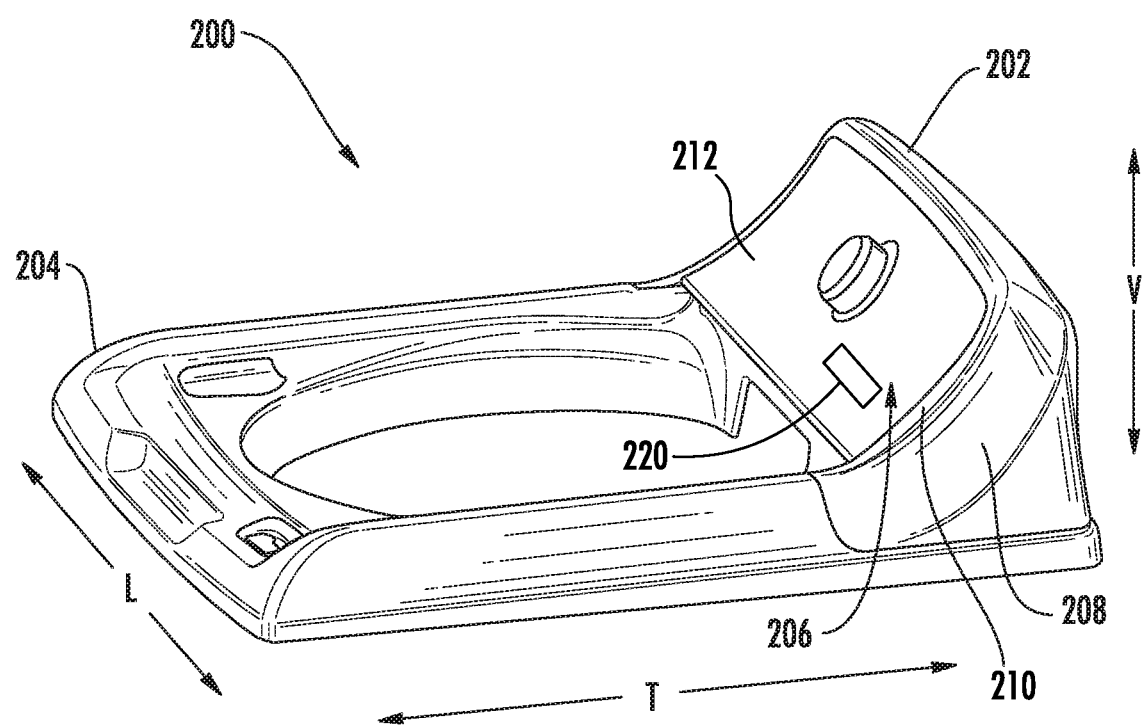
FIG. 2 provides a perspective view of a top cover assembly for a washing machine appliance according to an exemplary embodiment of the present disclosure.
Figure 3:
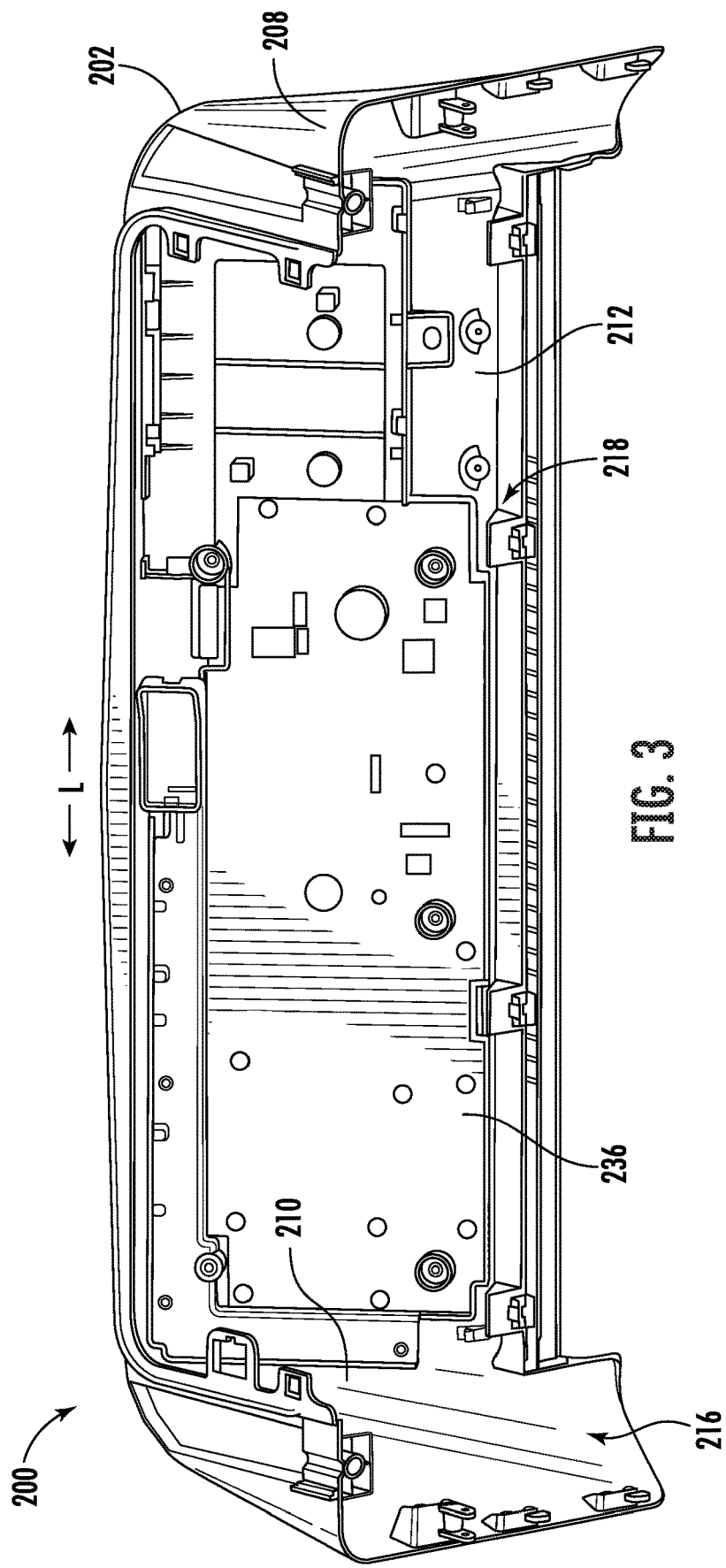
FIG. 3 provides a rear perspective view of an internal portion of the user interface on the top cover assembly of FIG. 2.
Figure 4:
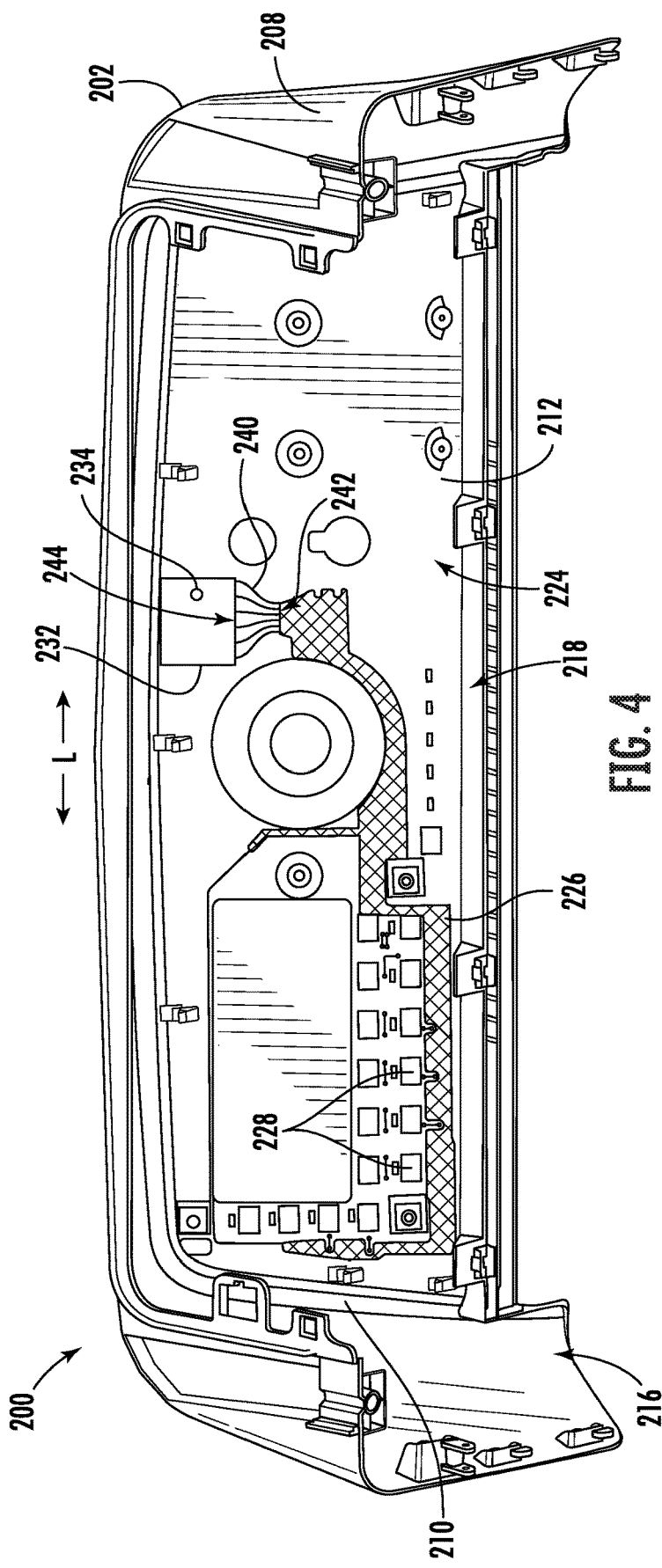
FIG. 4 provides a rear perspective view of the user interface of FIG. 3, wherein a main circuit board has been removed for clarity.
Figure 5:
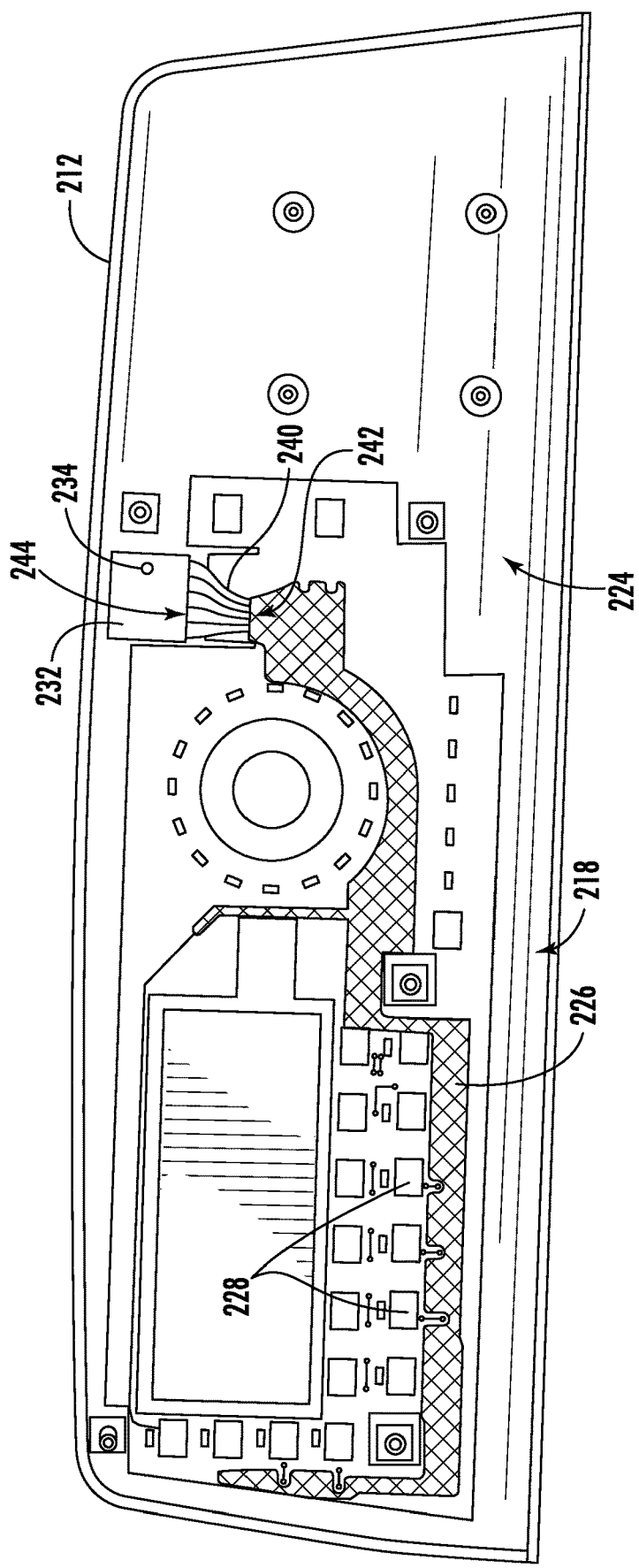
FIG. 5 provides a rear perspective view of a touch panel of the user interface of FIG. 3.
Figure 6:
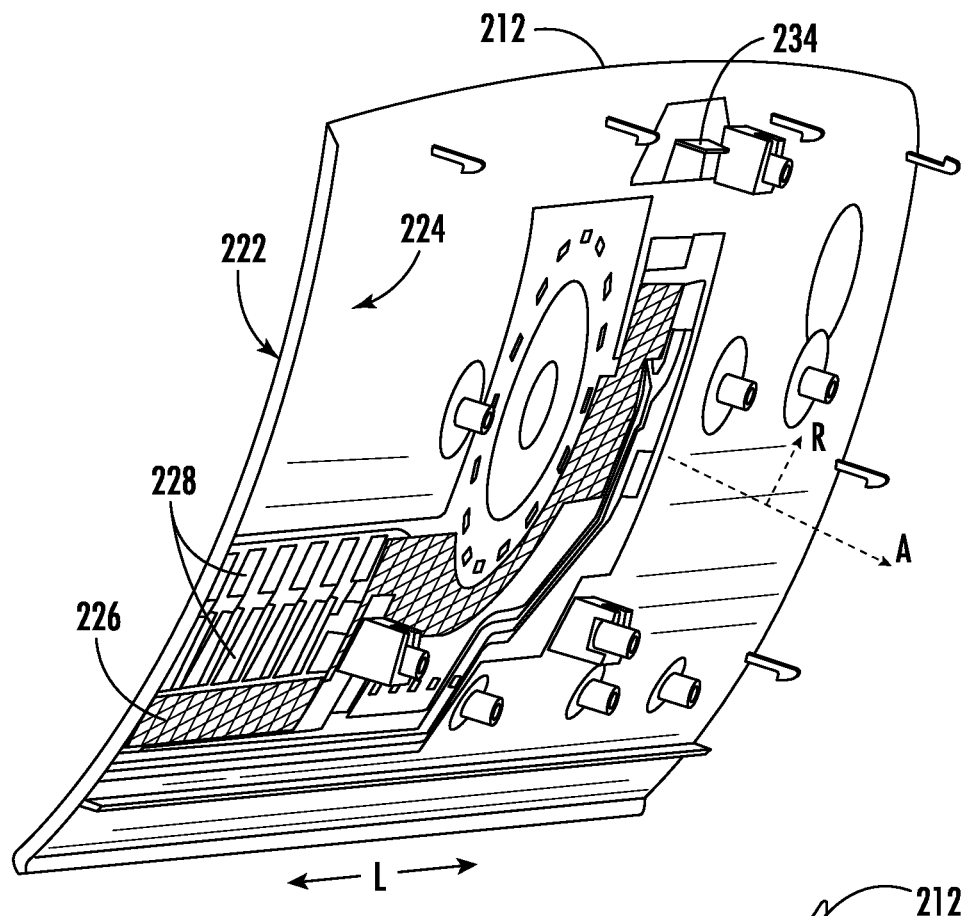
FIG. 6 provides a rear, side perspective view of a substrate panel of the user interface of FIG. 3.
Figure 7:
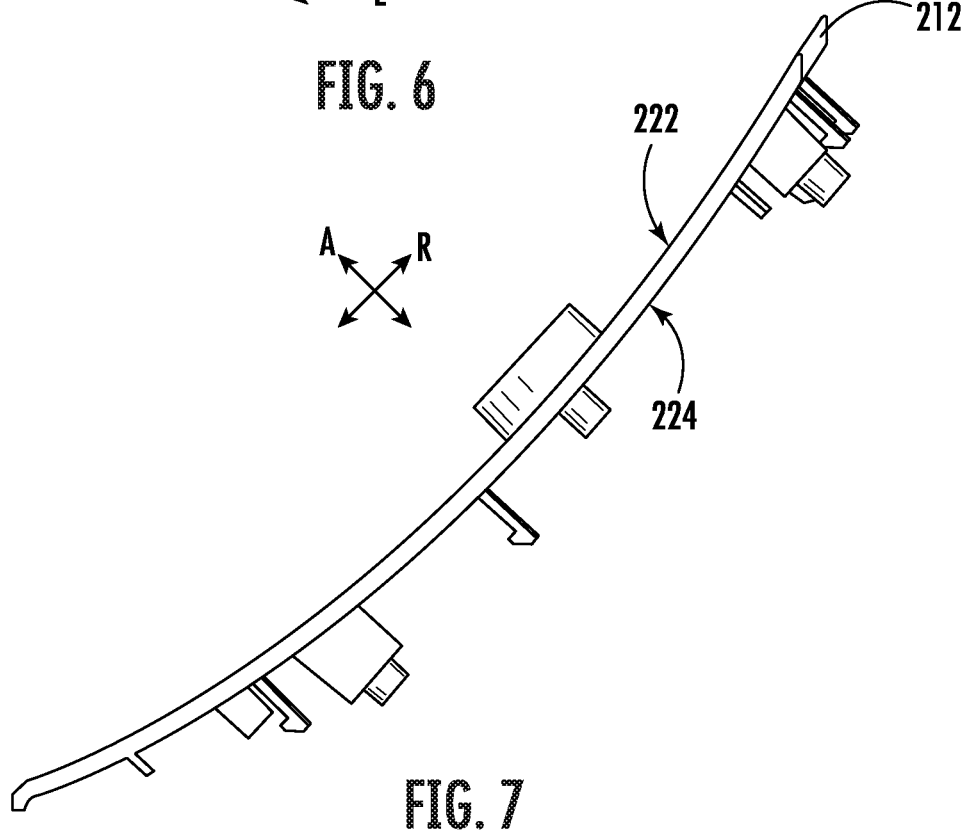
FIG. 7 provides a side perspective view of a substrate panel of the user interface of FIG. 3.
Figure 8:
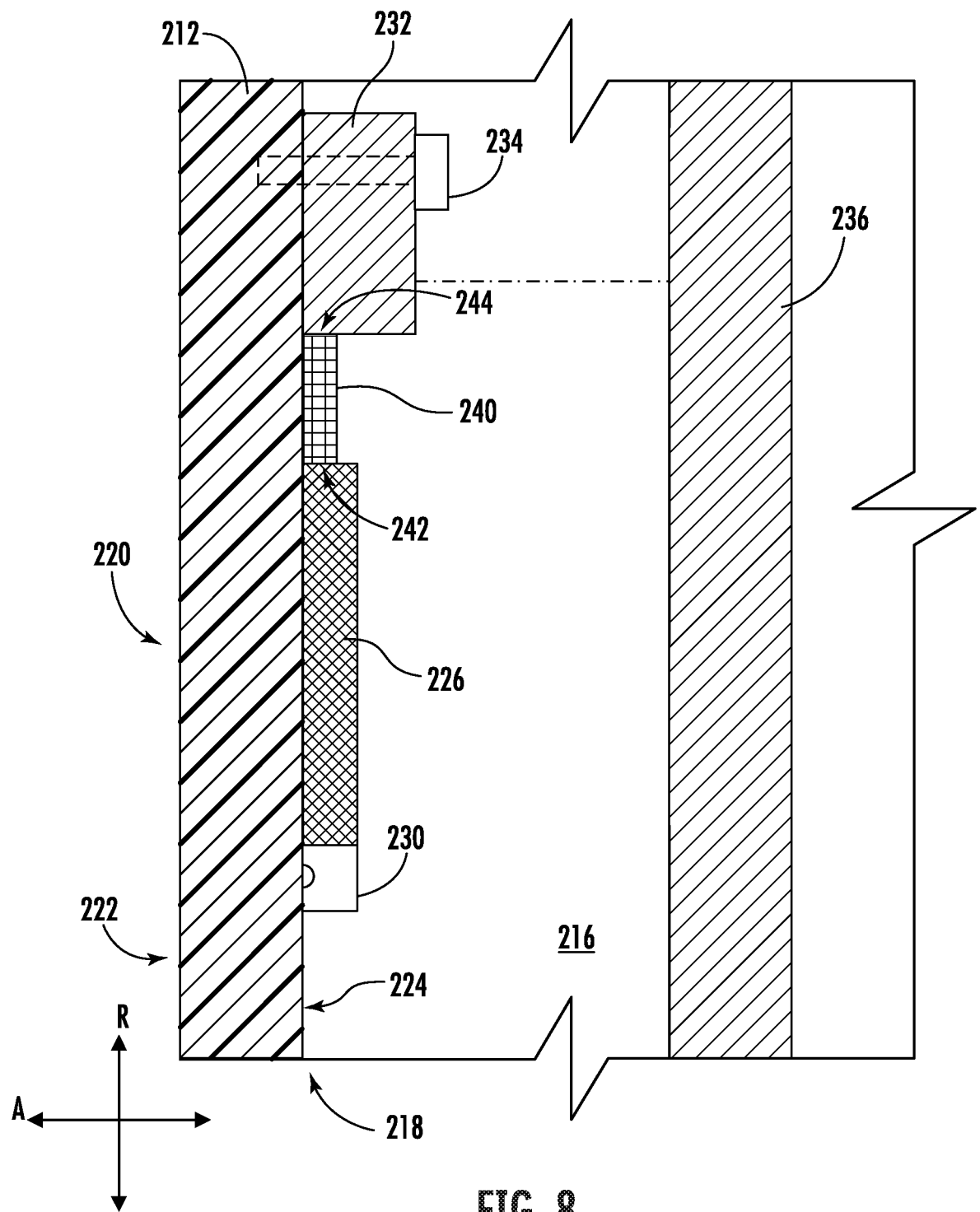
FIG. 8 provides a schematic, section view of a portion of a user interface according to exemplary embodiments of the present disclosure.

Turning to FIGS. 2 through 4, an exemplary embodiment of a top cover assembly 200 is illustrated. As shown, a selectively removable backsplash 202 and user interface 206 may be provided on a preformed top cover 204. It is understood that the backsplash 202, user interface, and top cover 204 could be embodied as backsplash 106, user interface 110, and top cover 104 illustrated in FIG. 1.

As illustrated, some embodiments of backsplash 202 include an enclosed housing 208 mounted to top cover 204. Enclosed housing 208 may include one or more perimeter walls 210 attached to a preformed substrate panel 212. Substrate panel 212 may be substantially flat or at least partially curved. Moreover, substrate panel 212 may form or serve as a front fascia of user interface 206. Perimeter wall 210 extends about substrate panel 212 and rests on the top cover 204. Within perimeter wall 210 and substrate panel 212 (e.g., between substrate panel 212 and top cover 204) enclosed housing 208 may define an internal volume 216. Internal volume 216 is generally positioned over top cover 204 and may contain at least a portion of user interface 206.

In exemplary embodiments, a touch panel 218 is disposed across a portion of enclosed housing 208 as an input selector. For instance, touch panel 218 may be disposed across or included with substrate panel 212. Optionally, touch panel 218 may define one or more discrete capacitive touch zones 220 for input (e.g., on substrate panel 212). Additionally or alternatively, touch zone(s) 220 may be provided as input selectors 120 (FIG. 1). During operation of the appliance 100 (FIG. 1), a user's touch or engagement with the discrete touch zones 220 of the touch panel 218 may select or initiate one or more functions of the appliance 100, such as the mode of operation, water temperature selected, and other relevant information. At the touch panel 218, variations in capacitance caused by a user's engagement may be detected. In response, user interface 206 may cause one or more functions to be selected or initiated (e.g., via controller 150—FIG. 1). Optionally, one or more of the touch zones 220 may be labeled (e.g., via a printed text or design) to indicate one or more functions to which the touch zone 220 corresponds.

In certain embodiments, at least a portion of substrate panel 212 is formed from one or more suitable dielectric and solid or nonpermeable materials, such as a plastic material (e.g., acrylic, polycarbonate, etc.) or ceramic material (e.g., glass or glass-ceramic). As shown, substrate panel 212 may define an axial direction A (e.g., perpendicular to the lateral direction L). In particular, axial direction A may extend from a front surface 222 to a rear surface 224 of substrate panel 212. When assembled, front surface 222 may face outward (e.g., away from internal volume 216) and may define the surface of touch zones 220 that a user contacts (e.g., to engage touch panel 218). By contrast, rear surface 224 is spaced apart from the front surface 222 along the axial direction A and may face inward (e.g., toward internal volume 216, or otherwise away from the surface of touch zones 220 that a user contacts (e.g., to engage touch panel 218).

Generally, substrate panel 212 may be formed according to any suitable shape (e.g., as a linear, flat plate or non-linear, curved plate). In the illustrated embodiments, the substrate panel 212 is formed as, and thus includes, a non-linear, curved plate. In some embodiments, the front surface 222 or the rear surface 224 is defined along a curve or arc relative to a radial direction R (e.g., perpendicular to the axial direction A). For instance, a cross-section of substrate panel 212 may define a concave surface or panel (e.g., directed outward) that a user can contact or engage. In additional or alternative embodiments, the front surface 222 and the rear surface 224 are parallel to each other. As shown, the front surface 222 and the rear surface 224 may extend parallel to the lateral direction L.

On the substrate panel 212, a flexible capacitance touch circuit ("flexible circuit") 226 is mounted. Specifically, flexible circuit 226 is joined to substrate panel 212. As an example, flexible circuit 226 may be joined to substrate panel 212 via a suitable adhesive, such as an acrylic or epoxy. As an additional or alternative example, flexible circuit 226 may be joined to substrate panel 212 via a suitable molding process, such as overmolding. Generally, flexible circuit 226 forms a deformable electric circuit that can be bent or twisted (e.g., prior to being mounted to substrate panel 212) and thus match the shape of at least a portion of substrate panel 212, such as a non-linear, curved surface. Flexible circuit 226 has multiple electrical or conductive paths (e.g., on a polyimide or laminate base), as would be understood. Moreover, one or more touch sensors 228 are included with flexible circuit 226. In particular, touch sensors 228 may be mounted to substrate panel 212 (e.g., adhered to the rear surface 224) at the touch zones 220 (e.g., to detect variations in capacitance, as would be understood). In some embodiments, flexible circuit 226 is adhered to the rear surface 224. Thus, touch sensors 228 may be spaced apart from the front surface 222.

In optional embodiments, one or more light sources 230 are mounted to or included with flexible circuit 226 (e.g., separate from or in addition to touch sensors 228). For instance, a light-emitting diode (LED) light source 230 may be electrically connected to flexible circuit 226 on rearward surface. In some such embodiments, an aperture or transparent region may be defined through substrate panel 212 (e.g., along the axial direction A) to receive light emissions from the light source 230.

When assembled, flexible circuit 226 is electrically connected (e.g., in electrical communication with) a rigid circuit board 232 (e.g., as or as part of controller 150—FIG. 1) and may thus transmit or receive electrical signals to/from rigid circuit board 232. In some such embodiments, rigid circuit board 232 includes or is provided as a printed circuit board (PCB) (e.g., linear, flat PCB) onto which one or more electrical components and electrical circuit paths may be provided. For instance, components for registering changes in capacitance detected at touch sensors 228 may be included on rigid circuit board 232, as would be understood. During use, rigid circuit board 232 may thus determine if and when a user contacts a corresponding touch zone 220. Such determinations may in turn direct or prompt controller 150 to control operations of washing machine appliance 100. Additionally or alternatively, rigid circuit board 232 may include components to power or direct activation of the one or more light sources 230, such as to indicate a user input, state of the appliance, state of a wash cycle, or any other relevant information to a user.

In certain embodiments, rigid circuit board 232 is positioned behind the substrate panel 212 along the axial direction A. For instance, rigid circuit board 232 may be mounted within internal volume 216. In particular, rigid circuit board 232 may be selectively or removably attached to touch panel 218, such as at the substrate panel 212. In some such embodiments, rigid circuit board 232 is selectively attached to substrate panel 212 at the rear surface 224. Additionally or alternatively, one or more mechanical fasteners 234, such as a screw, bolt, heatstake, or snap, may attach (e.g., mechanically fasten) rigid circuit board 232 to substrate panel 212. For instance, a mechanical fastener 234 may secure the flat rigid circuit board 232 to a curved portion of rear surface 224.

In optional embodiments, a primary circuit board 236 may be provided in addition to rigid circuit board 232. For instance, primary circuit board 236 may be provided as or as part of controller 150 (FIG. 1) in electrical communication with rigid circuit board 232. Thus, although being physically separate or separated (e.g., along the axial direction A) rigid circuit board 232 may be electrically connected to rigid circuit board 232 (e.g., when assembled). As would be understood, a suitable electrical path, wire, or harness may be provided between rigid circuit board 232 and primary circuit board 236. Additionally or alternatively, rigid circuit board 232 may be supported on primary circuit board 236. Optionally, rigid circuit board 232 may be attached (e.g., electrically connected to) primary circuit board 236 subsequent to rigid circuit board 232 fastening to substrate panel 212.

Along with being electrically connected to flexible circuit 226, rigid circuit board 232 is mechanically attached or connected to flexible circuit 226. As shown, a deformable conductive joint 240 extends between flexible circuit 226 and rigid circuit board 232. Specifically, deformable conductive joint 240 may extend (e.g., radially or along a non-parallel angle relative to the axial direction A) between a first end 242 and a second end 244. First end 242 is bonded (e.g., permanently fixed) to flexible circuit 226 and second end 244 is bonded to rigid circuit board 232. A direct electrical and mechanical connection is thus formed between the flexible circuit 226 and rigid circuit board 232 via deformable conductive joint 240. In other words, the bonded connection may be plug-free.

In exemplary embodiments, deformable conductive joint 240 includes or is provided as an anisotropic conductive film (ACF). In turn, flexible circuit 226 may be bonded to the deformable conductive joint 240 at the first end 242, via ACF bonding. Additionally or alternatively, rigid circuit board 232 may be bonded to the deformable conductive joint 240 at the second end 244, via ACF bonding. Optionally, deformable conductive joint 240 may be bonded to flexible circuit 226 or rigid circuit board 232 prior to adhering flexible circuit 226 to substrate panel 212 and prior to mechanically fastening rigid circuit board 232 to substrate panel 212. Moreover, deformable conductive joint 240 may be bonded to rigid circuit board 232 prior to attaching rigid circuit board 232 to primary circuit board 236.

Advantageously, the connection between flexible circuit 226 and rigid circuit board 232 may be markedly more robust or reliable than, for instance, would be provided by an electrical harness or removable plug. Moreover, electrical communication may be maintained even in the face of significant vibrations or movement of appliance 100 as a whole. Additionally or alternatively, assembly or service tolerances may be improved as rigid circuit board 232 may be shifted or moved incrementally relative to flexible circuit 226 board without severing their electrical communication through deformable conductive joint 240.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance user interface, the appliance user interface comprising:
    a substrate panel;
    a flexible capacitance touch circuit joined to the substrate panel;
    a deformable conductive joint extending from a first end of the deformable conductive joint to a second end of the deformable conductive joint, the first end being bonded to the flexible capacitance touch circuit; and
    a rigid circuit board bonded to the deformable conductive joint at the second end, the rigid circuit board being positioned behind the substrate panel along an axial direction.

2. The appliance user interface of claim 1, wherein the substrate panel comprises a non-permeable dielectric material.

3. The appliance user interface of claim 1, wherein the flexible capacitance touch circuit is adhered to the substrate panel.

4. The appliance user interface of claim 3, wherein the substrate panel comprises a non-linear, curved plate.

5. The appliance user interface of claim 3, wherein the substrate panel defines a front surface and a rear surface spaced apart from the front surface along the axial direction, and wherein the flexible capacitance touch circuit is adhered to the rear surface.

6. The appliance user interface of claim 3, wherein the substrate panel defines a front surface and a rear surface spaced apart from the front surface along the axial direction, and wherein the rigid circuit board is selectively attached to the substrate panel at the rear surface.

7. The appliance user interface of claim 1, wherein the rigid circuit board is mechanically fastened to the substrate panel.

8. The appliance user interface of claim 1, further comprising a primary circuit board in electrical communication with the rigid circuit board and spaced apart therefrom.

9. The appliance user interface of claim 1, wherein the deformable conductive joint comprises an anisotropic conductive film, and wherein the rigid circuit board is bonded to the deformable conductive joint via anisotropic conductive film bonding.

10. A laundry appliance for treating articles therein, the laundry appliance comprising:
    a cabinet defining an opening for receipt of the articles to be treated;
    an interface bracket disposed on the cabinet; and
    a user interface disposed on the interface bracket, the user interface comprising
        a substrate panel,
        a flexible capacitance touch circuit joined to the substrate panel,
        a deformable conductive joint extending from a first end of the deformable conductive joint to a second end of the deformable conductive joint, the first end being bonded to the flexible capacitance touch circuit, and
        a rigid circuit board bonded to the deformable conductive joint at the second end, the rigid circuit board being positioned behind the substrate panel along an axial direction.

11. The laundry appliance of claim 10, wherein the substrate panel comprises a non-permeable dielectric material.

12. The laundry appliance of claim 10, wherein the flexible capacitance touch circuit is adhered to the substrate panel.

13. The laundry appliance of claim 12, wherein the substrate panel comprises a non-linear, curved plate.

14. The laundry appliance of claim 12, wherein the substrate panel defines a front surface and a rear surface spaced apart from the front surface along the axial direction, and wherein the flexible capacitance touch circuit is adhered to the rear surface.

15. The laundry appliance of claim 12, wherein the substrate panel defines a front surface and a rear surface spaced apart from the front surface along the axial direction, and wherein the rigid circuit board is selectively attached to the substrate panel at the rear surface.

16. The laundry appliance of claim 10, wherein the rigid circuit board is mechanically fastened to the substrate panel.

17. The laundry appliance of claim 10, further comprising a primary circuit board in electrical communication with the rigid circuit board and spaced apart therefrom.

18. The laundry appliance of claim 10, wherein the deformable conductive joint comprises an anisotropic conductive film, and wherein the rigid circuit board is bonded to the deformable conductive joint via anisotropic conductive film bonding.

* * * * *